(12) United States Patent  
Huang et al.

(10) Patent No.: US 12,206,431 B2  
(45) Date of Patent: Jan. 21, 2025

(54) COMPARATOR-BASED SWITCHED-CAPACITOR CIRCUIT

(71) Applicant: REALTEK SEMICONDUCTOR CORPORATION, Hsinchu (TW)

(72) Inventors: Shih-Hsiung Huang, Hsinchu (TW); Wei-Cian Hong, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 161 days.

(21) Appl. No.: 18/119,311

(22) Filed: Mar. 9, 2023

(65) Prior Publication Data

US 2023/0308110 A1 Sep. 28, 2023

(30) Foreign Application Priority Data

Mar. 22, 2022 (TW) .................................. 111110682

(51) Int. Cl.
*H03M 1/12* (2006.01)
*H03M 1/46* (2006.01)
*H03H 19/00* (2006.01)

(52) U.S. Cl.
CPC .......... *H03M 1/466* (2013.01); *H03H 19/004* (2013.01)

(58) Field of Classification Search
CPC ................................ H03M 1/466; H03H 19/04
USPC .................................. 341/172, 144, 155
See application file for complete search history.

(56) References Cited

U.S. PATENT DOCUMENTS

| 4,633,223 | A | * | 12/1986 | Senderowicz | .......... | H03F 3/005 |
| | | | | | | 341/172 |
| 6,184,811 | B1 | * | 2/2001 | Nagari | .................. | H03M 3/342 |
| | | | | | | 341/172 |
| 6,617,994 | B1 | * | 9/2003 | Heim | .................... | H03M 1/361 |
| | | | | | | 341/172 |
| 8,686,888 | B2 | | 4/2014 | Chou et al. | | |
| 2007/0035434 | A1 | * | 2/2007 | Tachibana | ............. | H03M 1/468 |
| | | | | | | 341/161 |
| 2016/0011615 | A1 | | 1/2016 | Hu et al. | | |

OTHER PUBLICATIONS

OA letter of a counterpart TW application (appl. No. 111110682) mailed on Mar. 29, 2023.

(Continued)

*Primary Examiner* — Peguy Jean Pierre (74) *Attorney, Agent, or Firm* — WPAT, PC (57) ABSTRACT

A comparator-based switched-capacitor circuit has a first input terminal, a second input terminal, a first output terminal, and a second output terminal, and includes an analog-to-digital converter (ADC), a decoder, and a switch-capacitor network. The ADC is coupled to the first input terminal and the second input terminal and includes a plurality of comparators. The decoder is coupled to the ADC. The switch-capacitor network includes a comparator, a first current source, a second current source, a plurality of switches, and a plurality of capacitors. The first current source is coupled to the comparator and the first output terminal. The second current source is coupled to the comparator and the second output terminal. The voltage of the first output terminal and the voltage of the second output terminal do not exceed a target range.

10 Claims, 14 Drawing Sheets

(56) References Cited

OTHER PUBLICATIONS

Andrew M. Abo et al., "A 1.5-V, 10-bit, 14.3-MS/s CMOS pipeline analog-to-digital converter", May 1999, vol. 34, No. 5, IEEE Journal of Solid-State Circuits.

Mohammad Taherzadeh-Sani et al., "Area and Power Optimization of High-Order Gain Calibration in Digitally- Enhanced Pipelined ADCs", Apr. 2010, vol. 18, No. 4, IEEE Transactions on Very Large Scale Integration (VLSI) Systems.

* cited by examiner

|     | X0  | X1   | X2  | X3   | X4    | X5  | X6   | X7  |
|-----|-----|------|-----|------|-------|-----|------|-----|
| C1a | -Vr | -Vr  | -Vr | -Vr/2 | 0    | 0   | Vr/2 | Vr  |
| C1b | Vr  | Vr/2 | 0   | 0    | -Vr/2 | -Vr | -Vr  | -Vr |

|     | X0 | X1 | X2 | X3 | X4 | X5 | X6 | X7 | X8 | X9 | X10 | X11 | X12 | X13 | X14 | X15 |
|-----|----|----|----|----|----|----|----|----|----|----|-----|-----|-----|-----|-----|-----|
| b0  | 0  | 1  | 1  | 1  | 1  | 1  | 1  | 1  | 1  | 1  | 1   | 1   | 1   | 1   | 1   | 1   |
| b1  | 0  | 0  | 1  | 1  | 1  | 1  | 1  | 1  | 1  | 1  | 1   | 1   | 1   | 1   | 1   | 1   |
| b2  | 0  | 0  | 0  | 1  | 1  | 1  | 1  | 1  | 1  | 1  | 1   | 1   | 1   | 1   | 1   | 1   |
| b3  | 0  | 0  | 0  | 0  | 1  | 1  | 1  | 1  | 1  | 1  | 1   | 1   | 1   | 1   | 1   | 1   |
| b4  | 0  | 0  | 0  | 0  | 0  | 1  | 1  | 1  | 1  | 1  | 1   | 1   | 1   | 1   | 1   | 1   |
| b5  | 0  | 0  | 0  | 0  | 0  | 0  | 1  | 1  | 1  | 1  | 1   | 1   | 1   | 1   | 1   | 1   |
| b6  | 0  | 0  | 0  | 0  | 0  | 0  | 0  | 1  | 1  | 1  | 1   | 1   | 1   | 1   | 1   | 1   |
| b7  | 0  | 0  | 0  | 0  | 0  | 0  | 0  | 0  | 1  | 1  | 1   | 1   | 1   | 1   | 1   | 1   |
| b8  | 0  | 0  | 0  | 0  | 0  | 0  | 0  | 0  | 0  | 1  | 1   | 1   | 1   | 1   | 1   | 1   |
| b9  | 0  | 0  | 0  | 0  | 0  | 0  | 0  | 0  | 0  | 0  | 1   | 1   | 1   | 1   | 1   | 1   |
| b10 | 0  | 0  | 0  | 0  | 0  | 0  | 0  | 0  | 0  | 0  | 0   | 1   | 1   | 1   | 1   | 1   |
| b11 | 0  | 0  | 0  | 0  | 0  | 0  | 0  | 0  | 0  | 0  | 0   | 0   | 1   | 1   | 1   | 1   |
| b12 | 0  | 0  | 0  | 0  | 0  | 0  | 0  | 0  | 0  | 0  | 0   | 0   | 0   | 1   | 1   | 1   |
| b13 | 0  | 0  | 0  | 0  | 0  | 0  | 0  | 0  | 0  | 0  | 0   | 0   | 0   | 0   | 1   | 1   |
| b14 | 0  | 0  | 0  | 0  | 0  | 0  | 0  | 0  | 0  | 0  | 0   | 0   | 0   | 0   | 0   | 1   |

FIG. 11

| | X0 | X1 | X2 | X3 | X4 | X5 | X6 | X7 |
|---|---|---|---|---|---|---|---|---|
| C1a | $-Vr$ | $-5Vr/8$ | $-2Vr/8$ | $-2Vr/8$ | $-2Vr/8$ | $-2Vr/8$ | $-2Vr/8$ | $-2Vr/8$ |
| C2a | $-Vr$ | $-Vr$ | $-Vr$ | $-5Vr/8$ | $-2Vr/8$ | $-2Vr/8$ | $-2Vr/8$ | $-2Vr/8$ |
| C3a | $-Vr$ | $-Vr$ | $-Vr$ | $-Vr$ | $-Vr$ | $-5Vr/8$ | $-2Vr/8$ | $-2Vr/8$ |
| C1b | $Vr$ | $5Vr/8$ | $2Vr/8$ | $2Vr/8$ | $2Vr/8$ | $2Vr/8$ | $2Vr/8$ | $0$ |
| C2b | $Vr$ | $Vr$ | $Vr$ | $5Vr/8$ | $2Vr/8$ | $2Vr/8$ | $2Vr/8$ | $0$ |
| C3b | $Vr$ | $Vr$ | $Vr$ | $Vr$ | $Vr$ | $5Vr/8$ | $2Vr/8$ | $0$ |

| | X8 | X9 | X10 | X11 | X12 | X13 | X14 | X15 |
|---|---|---|---|---|---|---|---|---|
| C1a | $0$ | $0$ | $2Vr/8$ | $2Vr/8$ | $2Vr/8$ | $2Vr/8$ | $2Vr/8$ | $5Vr/8$ |
| C2a | $0$ | $0$ | $2Vr/8$ | $2Vr/8$ | $Vr$ | $5Vr/8$ | $Vr$ | $Vr$ |
| C3a | $0$ | $0$ | $2Vr/8$ | $5Vr/8$ | $Vr$ | $Vr$ | $Vr$ | $Vr$ |
| C1b | $0$ | $-2Vr/8$ | $-2Vr/8$ | $-2Vr/8$ | $-2Vr/8$ | $-2Vr/8$ | $-2Vr/8$ | $-5Vr/8$ |
| C2b | $0$ | $-2Vr/8$ | $-2Vr/8$ | $-2Vr/8$ | $-2Vr/8$ | $-5Vr/8$ | $-Vr$ | $-Vr$ |
| C3b | $0$ | $-2Vr/8$ | $-2Vr/8$ | $-5Vr/8$ | $-Vr$ | $-Vr$ | $-Vr$ | $-Vr$ |

|  | X0 | X1 | X2 | X3 | X4 | X5 | X6 | X7 |
|---|---|---|---|---|---|---|---|---|
| C1a | -2Vr/8 | -2Vr/8 | -2Vr/8 | -2Vr/8 | -2Vr/8 | -2Vr/8 | 0 | 0 |
| C2a | -Vr | -5Vr/8 | -2Vr/8 | -2Vr/8 | -2Vr/8 | -2Vr/8 | 0 | 0 |
| C3a | -Vr | -Vr | -Vr | -5Vr/8 | -2Vr/8 | -2Vr/8 | 0 | 0 |
| C1b | 2Vr/8 | 2Vr/8 | 2Vr/8 | 2Vr/8 | 2Vr/8 | 0 | 0 | -2Vr/8 |
| C2b | Vr | 5Vr/8 | 2Vr/8 | 2Vr/8 | 2Vr/8 | 0 | 0 | -2Vr/8 |
| C3b | Vr | Vr | Vr | 5Vr/8 | 2Vr/8 | 0 | 0 | -2Vr/8 |

|  | X8 | X9 | X10 | X11 | X12 | X13 | X14 | X15 |
|---|---|---|---|---|---|---|---|---|
| C1a | 2Vr/8 | 2Vr/8 | 2Vr/8 | 2Vr/8 | 2Vr/8 | 5Vr/8 | Vr | 11Vr/8 |
| C2a | 2Vr/8 | 2Vr/8 | 2Vr/8 | 5Vr/8 | Vr | Vr | Vr | Vr |
| C3a | 2Vr/8 | 5Vr/8 | Vr | Vr | Vr | Vr | Vr | Vr |
| C1b | -2Vr/8 | -2Vr/8 | -2Vr/8 | -2Vr/8 | -2Vr/8 | -5Vr/8 | -Vr | -11Vr/8 |
| C2b | -2Vr/8 | -2Vr/8 | -2Vr/8 | -5Vr/8 | -Vr | -Vr | -Vr | -Vr |
| C3b | -2Vr/8 | -5Vr/8 | -Vr | -Vr | -Vr | -Vr | -Vr | -Vr |

FIG. 14

COMPARATOR-BASED SWITCHED-CAPACITOR CIRCUIT

BACKGROUND OF THE INVENTION

1. Field of the Invention

The present invention generally relates to a switched-capacitor circuit (SC circuit), and, more particularly, to a comparator-based SC circuit.

2. Description of Related Art

Figure 1:
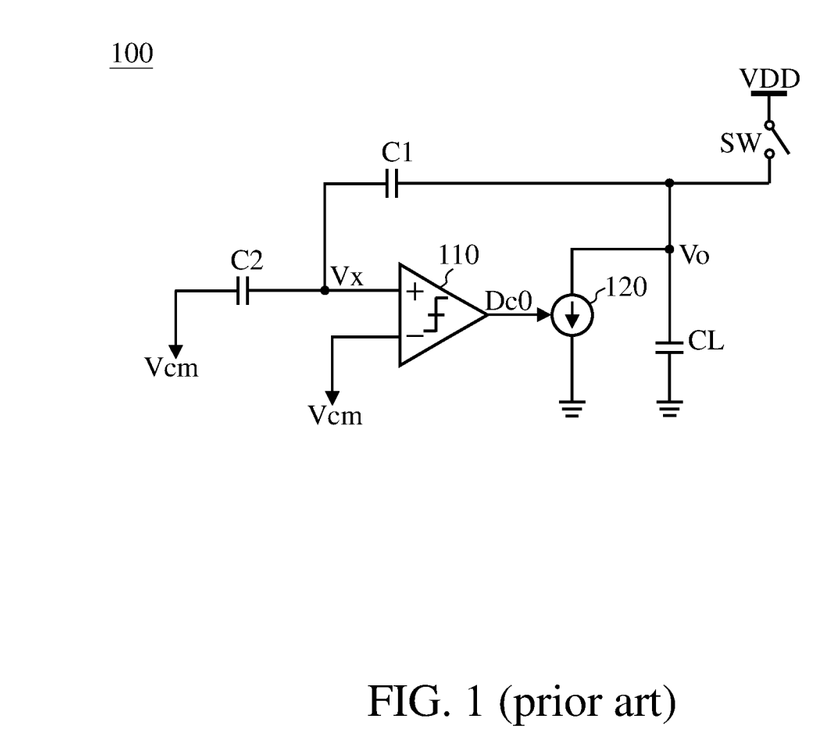
FIG. 1 shows a conventional comparator-based SC circuit.

FIG. 1 shows a conventional comparator-based SC circuit, which is also referred to as a zero-crossing-based circuit (ZCBC). The SC circuit 100 includes a comparator 110, a current source 120, a capacitor C1, a capacitor C2, a load capacitor CL, and a switch SW. Various circuits can be built based on the SC circuit 100, such as a multiplying digital-to-analog converter (multiplying DAC) of a pipelined analog-to-digital converter (pipelined ADC, also referred to as pipeline ADC).

The comparator 110 compares the voltage Vx at the positive input terminal with the reference voltage Vcm at the negative input terminal to generate the control signal Dc0, which controls the output current of the current source 120 to control the magnitude of the output voltage Vo (i.e., the terminal voltage of the load capacitor CL). When the switch SW is turned on, the output voltage Vo is reset to the power supply voltage VDD.

The current source 120 is usually embodied by a Metal-Oxide-Semiconductor Field-Effect Transistor (MOSFET), and the output voltage Vo is the drain voltage of the transistor. However, as the drain-source current of the current source 120 (Ids, which is the output current of the current source 120) is dependent on the drain-source voltage (Vds), the output current of the current source 120 is affected by the output voltage Vo, which decreases the linearity of the SC circuit 100.

SUMMARY OF THE INVENTION

In view of the issues of the prior art, an object of the present invention is to provide a comparator-based SC circuit, so as to make an improvement to the prior art.

According to one aspect of the present invention, a comparator-based SC circuit is provided. The comparator-based SC circuit has a first input terminal, a second input terminal, a first output terminal, and a second output terminal, and includes a comparator, an ADC, a decoder, a first switch, a second switch, a third switch, a fourth switch, a fifth switch, a sixth switch, a seventh switch, an eighth switch, a ninth switch, a tenth switch, a first current source, a second current source, a first capacitor, a second capacitor, a third capacitor, and a fourth capacitor. The ADC is coupled to the first input terminal and the second input terminal. The decoder is coupled to the ADC. The first current source is coupled to the comparator and the first output terminal. The second current source is coupled to the comparator and the second output terminal. The first capacitor has a first end and a second end. The first end is coupled to the first input terminal through the first switch and coupled to the first output terminal through the fourth switch, and the second end is coupled to the comparator and coupled to a reference voltage through the third switch. The second capacitor has a third end and a fourth end. The third end is coupled to the first input terminal through the second switch and coupled to the decoder through the fifth switch, and the fourth end is coupled to the comparator and coupled to the reference voltage through the third switch. The third capacitor has a fifth end and a sixth end. The fifth end is coupled to the second input terminal through the sixth switch and coupled to the second output terminal through the ninth switch, and the sixth end is coupled to the comparator and coupled to the reference voltage through the eighth switch. The fourth capacitor has a seventh end and an eighth end. The seventh end is coupled to the second input terminal through the seventh switch and coupled to the decoder through the tenth switch, and the eighth end is coupled to the comparator and coupled to the reference voltage through the eighth switch.

The technical means embodied in the embodiments of the present invention can solve at least one of the problems of the prior art. Therefore, the present invention has better linearity compared with the prior art.

These and other objectives of the present invention no doubt become obvious to those of ordinary skill in the art after reading the following detailed description of the preferred embodiments with reference to the various figures and drawings.

DETAILED DESCRIPTION OF THE EMBODIMENTS

The following description is written by referring to terms of this technical field. If any term is defined in this specification, such term should be interpreted accordingly. In addition, the connection between objects or events in the below-described embodiments can be direct or indirect provided that these embodiments are practicable under such connection. Said "indirect" means that an intermediate object or a physical space exists between the objects, or an intermediate event or a time interval exists between the events.

The disclosure herein includes comparator-based switched-capacitor circuits. On account of that some or all elements of the comparator-based switched-capacitor circuit could be known, the detail of such elements is omitted provided that such detail has little to do with the features of this disclosure, and that this omission nowhere dissatisfies the specification and enablement requirements. A person having ordinary skill in the art can choose components or steps equivalent to those described in this specification to carry out the present invention, which means that the scope of this invention is not limited to the embodiments in the specification.

Figure 2:
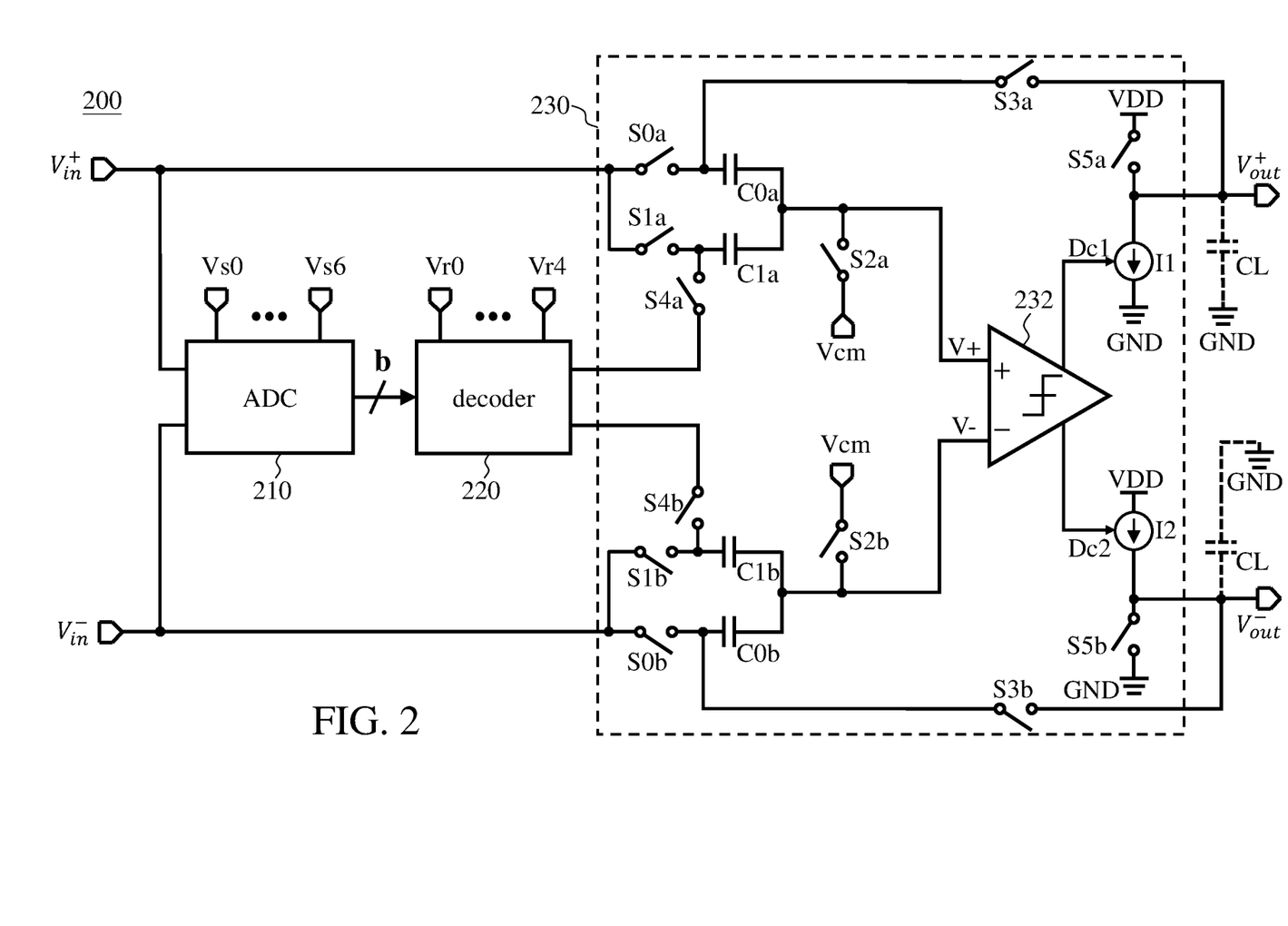
FIG. 2 is a circuit diagram of a comparator-based SC circuit according to an embodiment of the present invention.

FIG. 2 is a circuit diagram of a comparator-based SC circuit according to an embodiment of the present invention. The SC circuit 200 includes an ADC 210, a decoder 220, and a switch-capacitor network 230. The SC circuit 200 has a first input terminal (i.e., the terminal receiving the input signal $V_{in}^+$), a second input terminal (i.e., the terminal receiving the input signal $V_{in}^-$), a first output terminal (i.e., the terminal outputting the output signal $V_{out}^+$), and a second output terminal (i.e., the terminal outputting the output signal $V_{out}^-$).

The ADC 210 includes a plurality of comparators, and the comparators compare the differential input signal $V_{in}$ (including the input signals $V_{in}^+$ and $V_{in}^-$) with a plurality of predetermined voltages (Vs0 to Vs6) to obtain a digital signal b. The decoder 220 provides at least one of the plurality of reference voltages (Vr0 to Vr4) to the switch-capacitor network 230 (more specifically, to the capacitors C1a and C1b) according to the digital signal b. The switch-capacitor network 230 samples the differential input signal $V_{in}$ and performs comparison and/or operation on the sampled signals according to the target reference voltage provided by the decoder 220 to output the differential output signal $V_{out}$ (including the output signals $V_{out}^+$ and $V_{out}^-$).

By carefully designing the ADC 210 and the decoder 220, the output signal $V_{out}^+$ (i.e., the voltage at the first output terminal) and the output signal $V_{out}^-$ (i.e., the voltage at the second output terminal) of the SC circuit 200 are controlled within the target range. In other words, whether the differential input signal $V_{in}$ is large or small, the differential output signal $V_{out}$ does not exceed the target range. The ADC 210 and the decoder 220 will be discussed in detail below.

The switch-capacitor network 230 includes a comparator 232, a capacitor C0a, a capacitor C1a, a capacitor C0b, a capacitor C1b, switches S0a to S5a, switches S0b to S5b, a current source I1, and a current source I2. The reference voltage Vcm is the common mode voltage of the input signals $V_{in}^+$ and $V_{in}^-$. The current source I1 is coupled between the switch S5a and the ground level GND. The current source I2 is coupled between the power supply voltage VDD and the switch S5b. In some embodiments, the capacitance values of the capacitors C0a, C1a, C0b, and C1b are substantially the same.

One end of the capacitor C0a is coupled to the first input terminal through the switch S0a and coupled to the first output terminal through the switch S3a; the other end of the capacitor C0a is coupled to the comparator 232 and coupled to the reference voltage Vcm through the switch S2a. One end of the capacitor C1a is coupled to the first input terminal through the switch S1a and coupled to the decoder 220 through the switch S4a; the other end of the capacitor C1a is coupled to the comparator 232 and coupled to the reference voltage Vcm through the switch S2a. One end of the capacitor C0b is coupled to the second input terminal through the switch S0b and coupled to the second output terminal through the switch S3b; the other end of the capacitor C0b is coupled to the comparator 232 and coupled to the reference voltage Vcm through the switch S2b. One end of the capacitor C1b is coupled to the second input terminal through the switch S1b and coupled to the decoder 220 through the switch S4b; the other end of the capacitor C1b is coupled to the comparator 232 and coupled to the reference voltage Vcm through the switch S2b.

The SC circuit 200 operates alternately in a sampling phase and an operation phase. In the sampling phase, the switch S0a, the switch S1a, the switch S2a, the switch S0b, the switch S1b, and the switch S2b are turned on, and the switch S3a, the switch S4a, the switch S3b, and the switch S4b are turned off. In the operation phase, the switch S3a, the switch S4a, the switch S3b, and the switch S4b are turned on, and the switch S0a, the switch S1a, the switch S2a, the switch S0b, the switch S1b, and the switch S2b are turned off.

Figure 3:
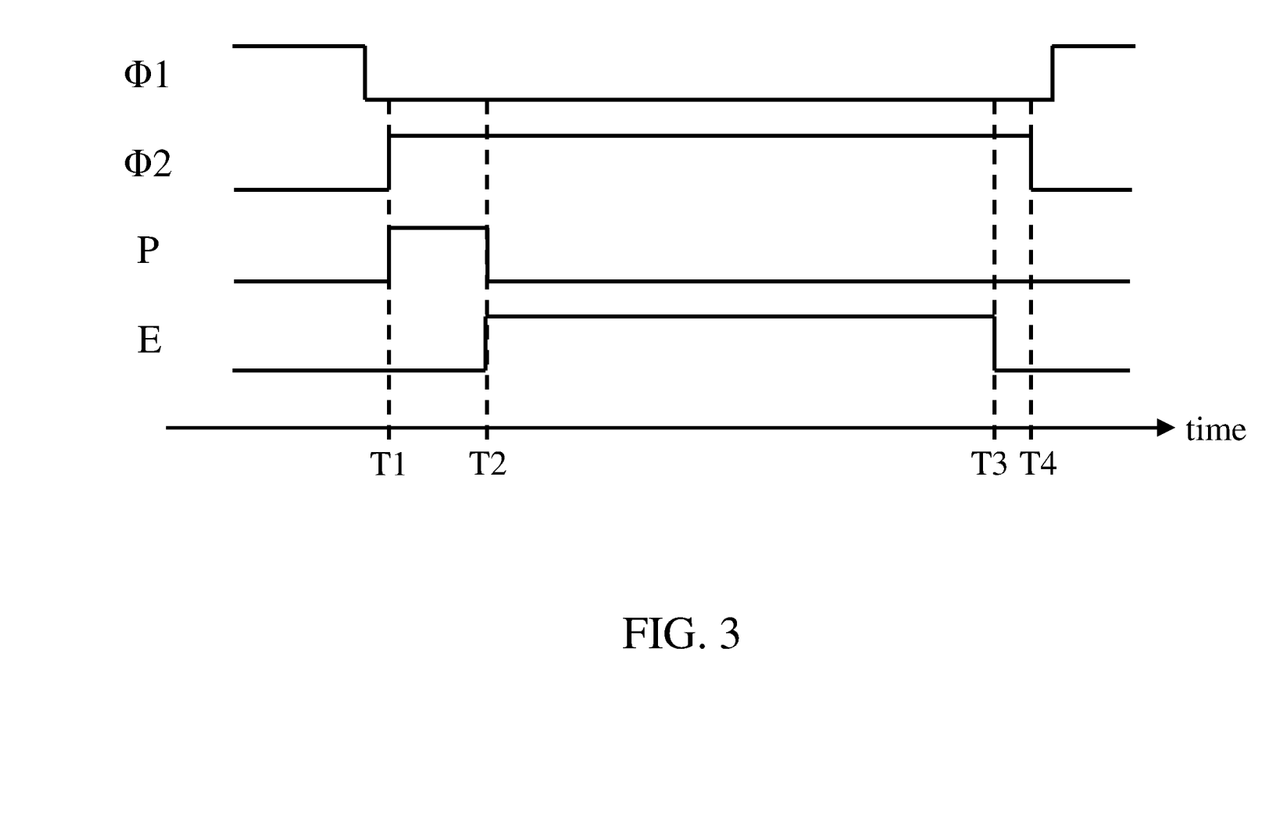
FIG. 3 is a timing diagram according to an embodiment of the present invention.

FIG. 3 is a timing diagram according to an embodiment of the present invention. The sampling phase corresponds to the clock Φ1 being at the first level (e.g., a high level), and the operation phase corresponds to the clock Φ2 being at the first level (e.g., between the time point T1 and the time point T4). The operation phase includes two sub-phases: the phase P and the phase E. The switch S5a and the switch S5b are turned on for a predetermined time period (T2-T1) in the phase P to reset the first output terminal and the second output terminal (the switch S5a and the switch S5b are turned off at other times), and then the current source I1 and the current source I2 are turned on (i.e., supplying current) in the phase E (between the time point T2 and the time point T3) to charge or discharge the load capacitor CL. The voltage V+ and the voltage V− are the input voltages of the comparator 232. The comparator 232 compares the voltage V+ and the voltage V− and outputs the control signal Dc1 and the control signal Dc2. When V+≥V−, the control signal Dc1 is at the first level (e.g., the high level or logic 1), and the control signal Dc2 is at the second level (e.g., a low level or logic 0). When V+<V−, the control signal Dc1 is at the second level, and the control signal Dc2 is at the first level.

The voltage V+ varies with the output signal $V_{out}^+$, and the voltage V− varies with the output signal $V_{out}^-$. The time point T3 corresponds to the reverse of the voltages at the input terminals of the comparator 232 (i.e., from V+≥V− to V+<V−, and vice versa); that is, the current source I1 and the current source I2 are turned off (stop supplying current) at the time point T3. When the current source I1 and the current source I2 are embodied by MOSFETs, the output signal $V_{out}^+$ and the output signal $V_{out}^-$ are the drain voltages of the MOSFETs.

Figure 4:
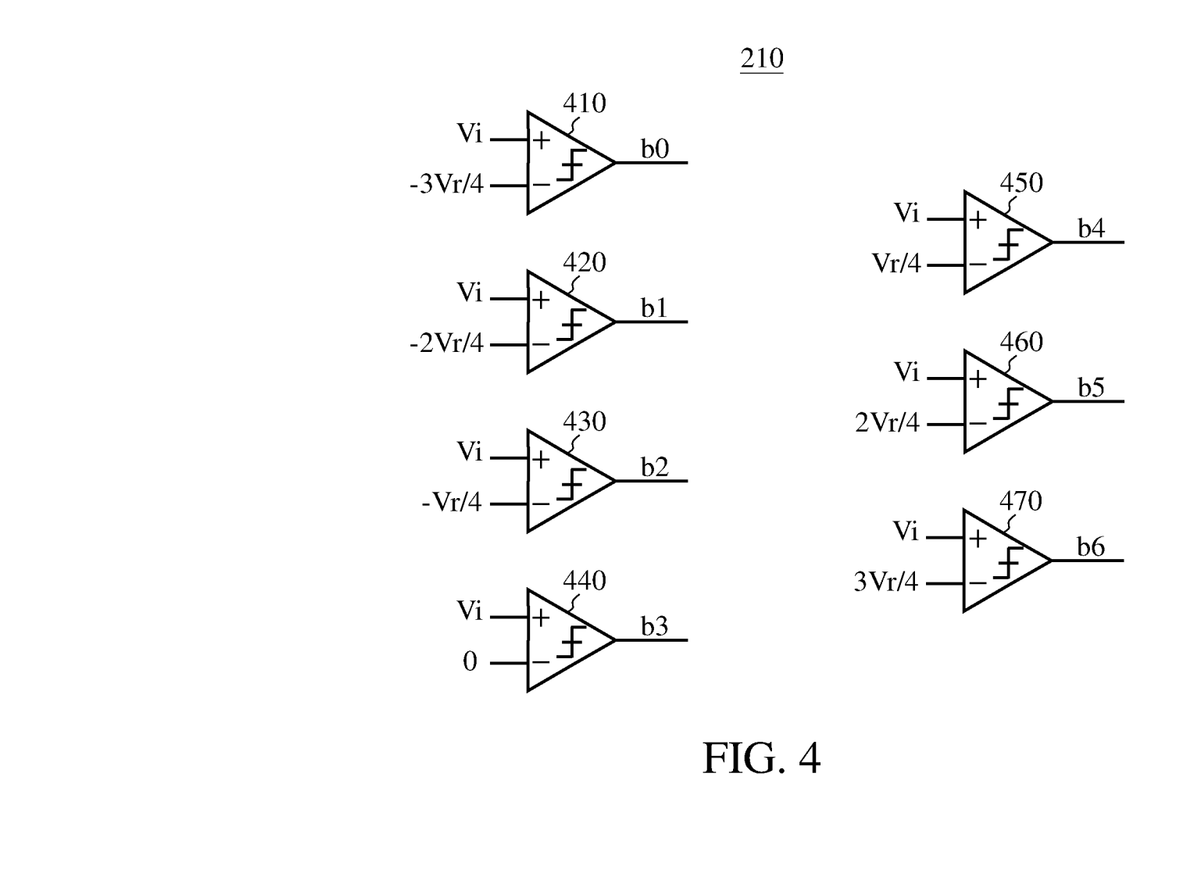
FIG. 4 is a circuit diagram of an ADC according to an embodiment of the present invention.
Figure 5:
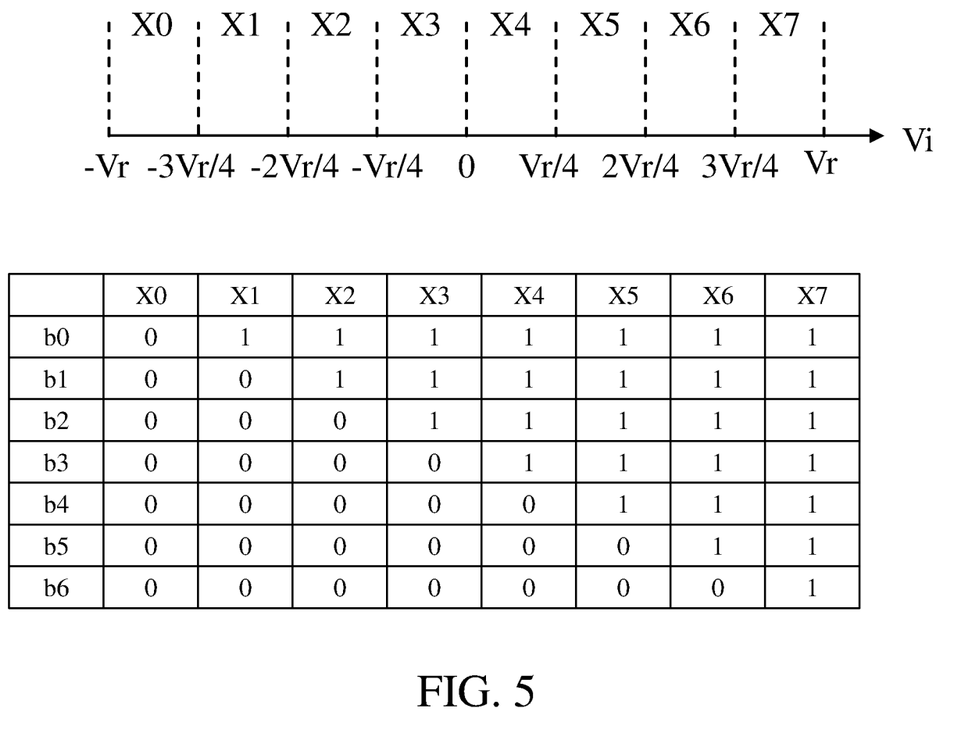
FIG. 5 shows the relationship between the intervals of the signal Vi and the output bits of the comparators.

FIG. 4 is a circuit diagram of the ADC 210 according to an embodiment of the present invention. The ADC 210 includes seven comparators (410, 420, 430, 440, 450, 460, and 470), and one end of each comparator receives a signal Vi (=$V_{in}^+$−$V_{in}^-$). These seven comparators respectively compare the signal Vi with seven preset voltages (−3Vr/4, −2Vr/4, −Vr/4, 0, Vr/4, 2Vr/4, and 3Vr/4, which respectively correspond to Vs0 to Vs6, where in general Vr can be between 0.5VDD and VDD) to output seven bits (b0, b1, b2, b3, b4, b5, and b6). The signal Vi is divided into eight intervals (X0, X1, X2, X3, X4, X5, X6, and X7) by the seven preset voltages. FIG. 5 shows the relationship between the intervals of the signal Vi and the output bits of the comparators. For example, when −Vr/4<Vi<0 (corresponding to the interval X3), the digital signal b that the ADC 210 outputs is (1110000) (corresponding to b0 to b6).

Figure 6:
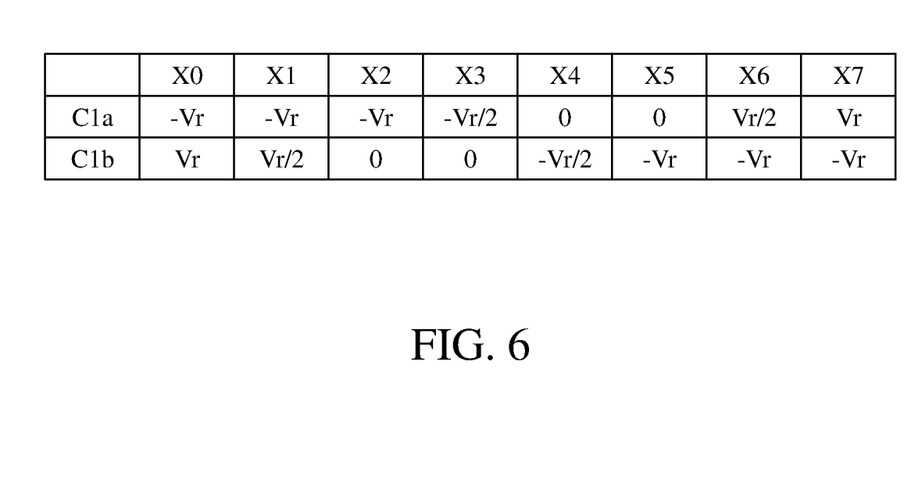
FIG. 6 shows the truth table of the decoder.

FIG. 6 shows the truth table of the decoder 220. When the signal Vi is in the interval X0, X1, X2, X3, X4, X5, X6, and X7, the decoder 220 outputs the voltages−Vr, −Vr, −Vr, −Vr/2, 0, 0, Vr/2, and Vr, respectively, to the capacitor C1a, and outputs the voltages Vr, Vr/2, 0, 0, −Vr/2, −Vr, −Vr, and −Vr, respectively, to the capacitor C1b (i.e., the reference voltages Vr0 to Vr4 in FIG. 2 correspond to −Vr, −Vr/2, 0, Vr/2 and Vr, respectively). In some embodiments, the decoder 220 may be embodied by logic circuits. In the operation phase, the output signals $V_{out}^+$ and $V_{out}^-$ change in response to the changes in the output voltage of the decoder 220.

Figure 7:
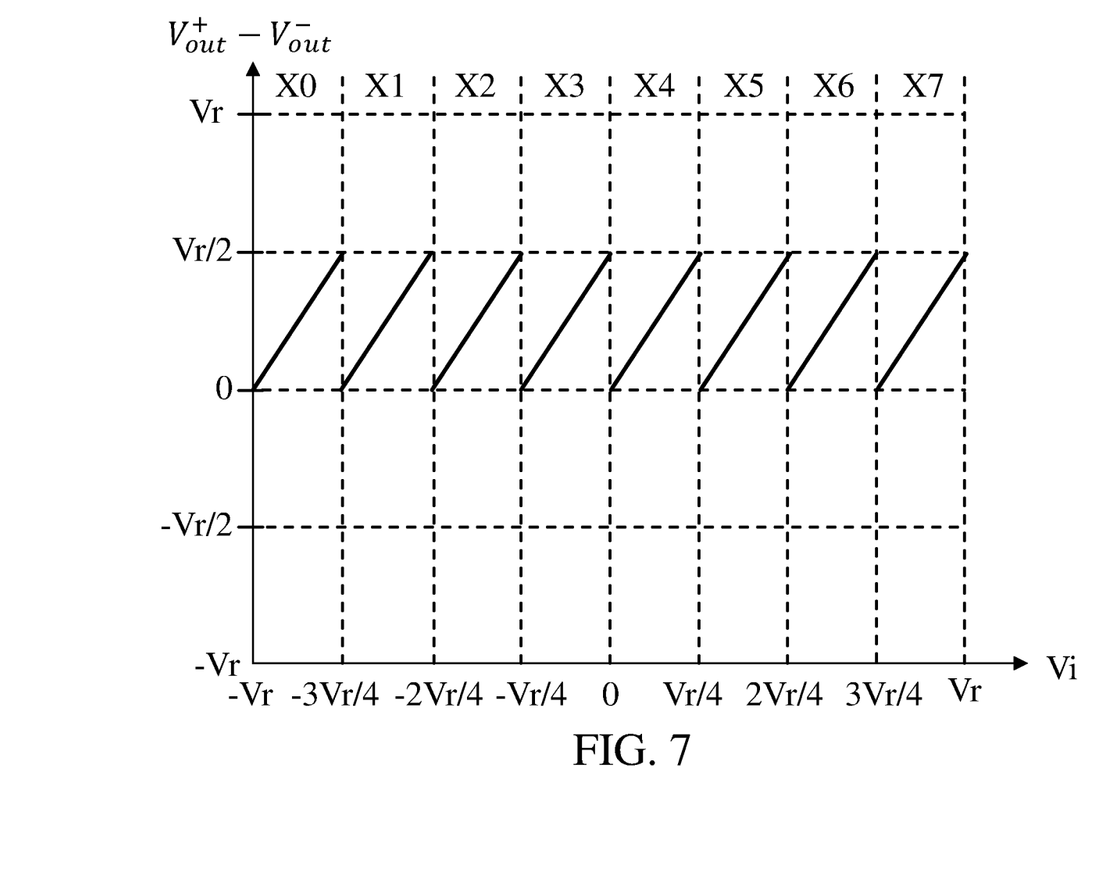
FIG. 7 shows the relationship between the output signal and the signal Vi.

FIG. 7 shows the relationship between the output signal $V_{out}(=V_{out}^+-V_{out}^-)$ and the signal Vi. As shown in FIG. 7, the range of the output signal $V_{out}(=V_{out}^+-V_{out}^-)$ falls only within the range between 0 and Vr/2. Although the current source I1 and the current source I2 are still affected by the output signal $V_{out}^+$ and the output signal $V_{out}^-$, the extent to which the current source I1 and the current source I2 are affected becomes smaller due to the relatively small variation of the output signal $V_{out}(=V_{out}^+-V_{out}^-)$ (i.e., the output signal is controlled within the target range); in other words, the SC circuit 200 is good in linearity.

Figure 8:
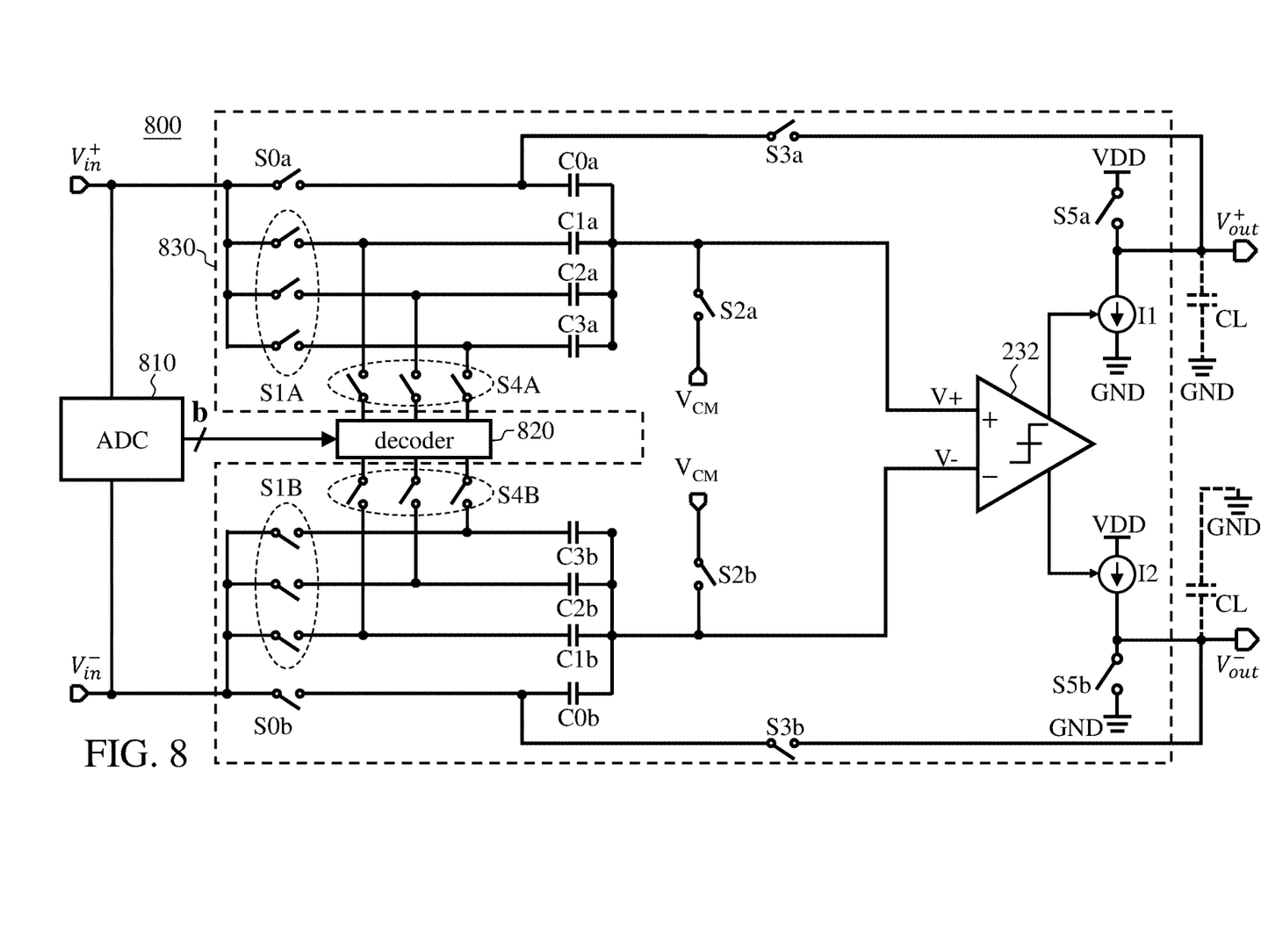
FIG. 8 is a circuit diagram of a comparator-based SC circuit according to another embodiment of the present invention.

FIG. 8 is a circuit diagram of the comparator-based SC circuit according to another embodiment of the present invention. The SC circuit 800 includes an ADC 810, a decoder 820, and a switch-capacitor network 830.

The ADC 810 has a similar function to the ADC 210, but the ADC 810 includes more comparators (corresponding to the reference voltages Vs0 to Vs14, not shown), which will be discussed in detail below.

The decoder 820 has a similar function to the decoder 220, but the decoder 820 can provide more reference voltages (e.g., 7 reference voltages (corresponding to the embodiments of FIGS. 10-12) or 9 reference voltages (corresponding to the embodiments of FIGS. 13-14)).

In comparison with the switch-capacitor network 230, the switch-capacitor network 830 further includes a capacitor C2a, a capacitor C3a, a capacitor C2b, and a capacitor C3b. The switch groups S1A, S1B, S4A, and S4B each include three switches, and the three switches of the same switch group are turned on or off at the same time. The on/off timings of the switch groups S1A, S1B, S4A, and S4B correspond to the on/off timings of the switch S1a, the switch S1b, the switch S4a, and the switch S4b in FIG. 2, respectively.

One end of the capacitor C1a (capacitor C2a, capacitor C3a) is coupled to the first input terminal through the switch group S1A and coupled to the decoder 820 through the switch group S4A; the other end of the capacitor C1a (capacitor C2a, capacitor C3a) is coupled to the comparator 232 and coupled to the reference voltage Vcm through the switch S2a. One end of the capacitor C1b (capacitor C2b, capacitor C3b) is coupled to the second input terminal through the switch group S1B and coupled to the decoder 820 through the switch group S4B; the other end of the capacitor C1b (capacitor C2b, capacitor C3b) is coupled to the comparator 232 and coupled to the reference voltage Vcm through the switch S2b.

Similarly, by carefully designing the ADC 810 and the decoder 820, the output signal $V_{out}^+$ (i.e., the voltage at the first output terminal) and the output signal $V_{out}^-$ (i.e., the voltage at the second output terminal) of the SC circuit 800 are controlled within the target range.

Figure 9:
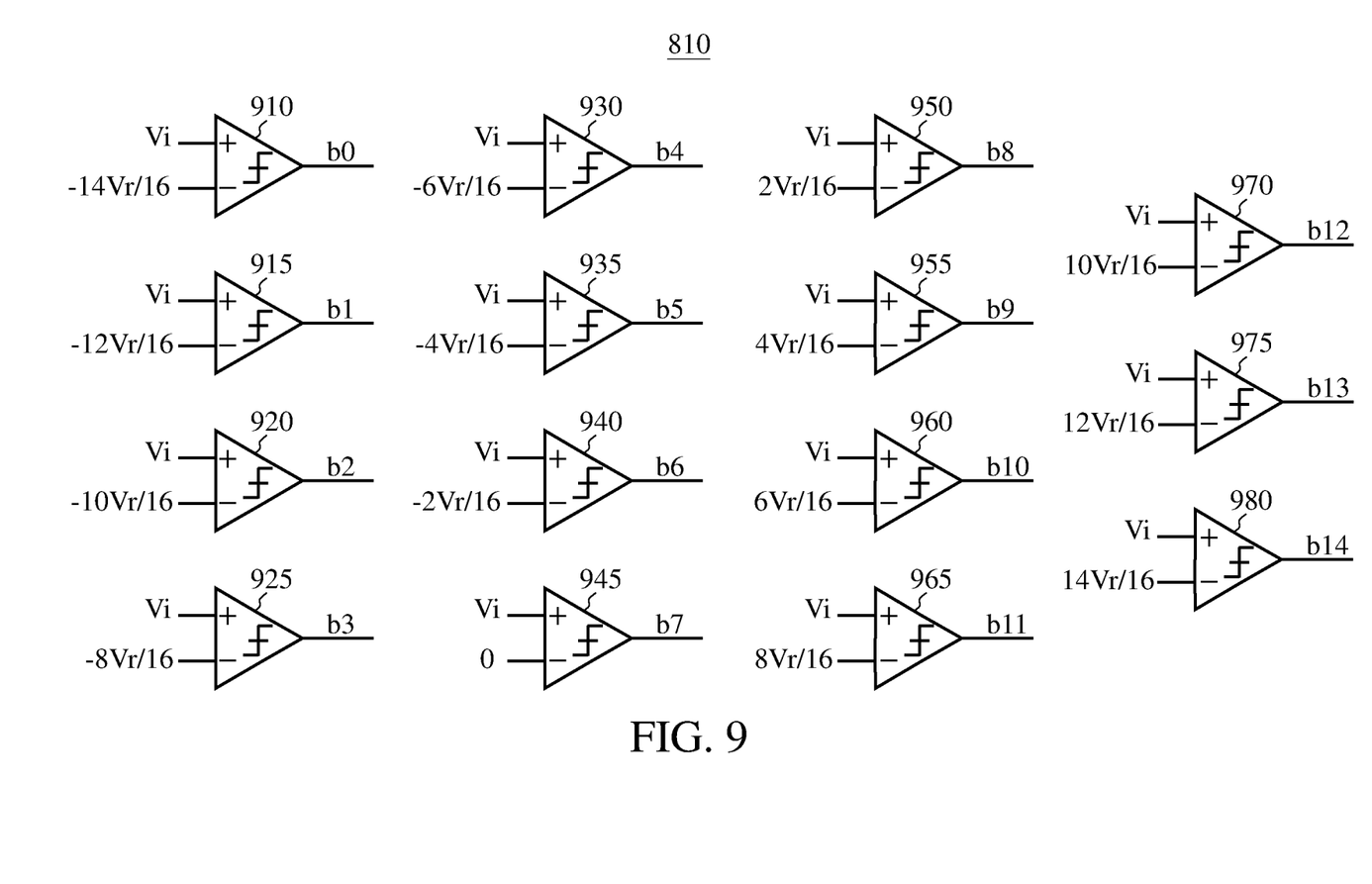
FIG. 9 is a circuit diagram of an ADC according to another embodiment of the present invention.

FIG. 9 is a circuit diagram of the ADC 810 according to an embodiment of the present invention. The ADC 810 contains 15 comparators (910, 915, 920, 925, 930, 935, 940, 945, 950, 955, 960, 965, 970, 975, and 980). The 15 comparators compare the signal Vi with 15 preset voltages (−14Vr/16, −12Vr/16, −10Vr/16, −8Vr/16, −6Vr/16, −4Vr/16, −2Vr/16, 0, 2Vr/16, 4Vr/16, 6Vr/16, 8Vr/16, 10Vr/16, 12Vr/16, and 14Vr/16, which respectively correspond to the reference voltages Vs0 to Vs14) and output 15 bits (b0, b1, b2, b3, b4, b5, b6, b7, b8, b9, b10, b11, b12, b13, and b14).

Figure 10:
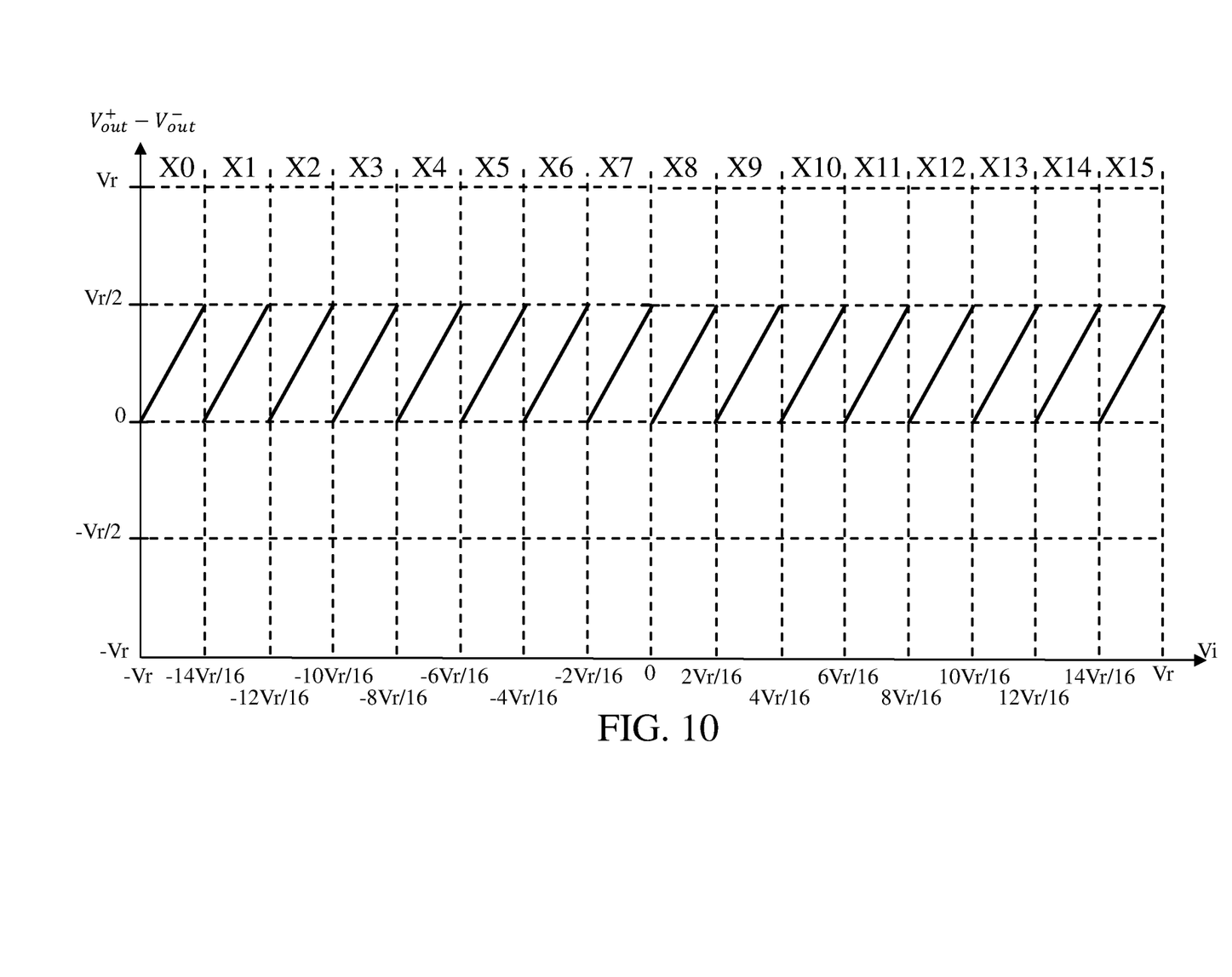
FIG. 10 shows the relationship between the output signal and the signal Vi.
Figure 11:
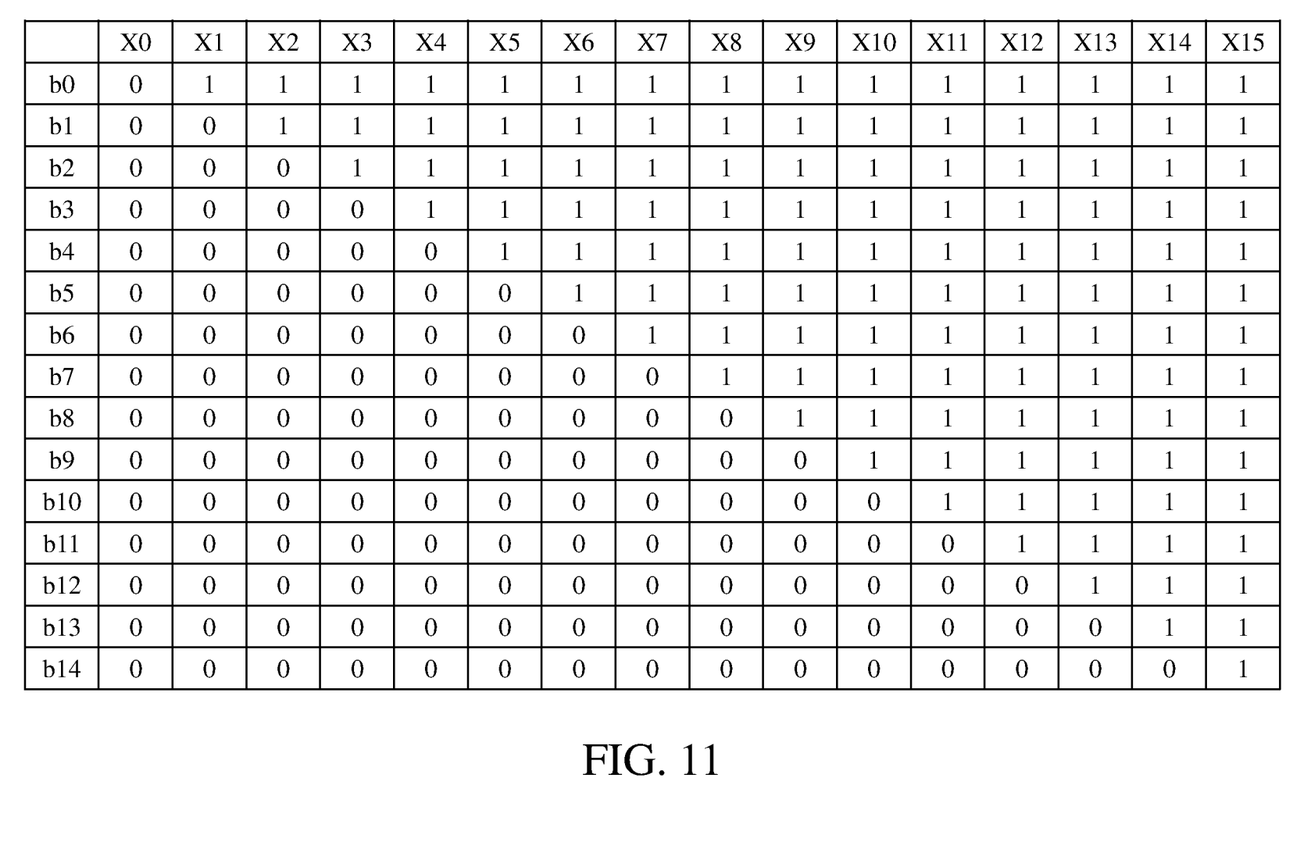
FIG. 11 shows the relationship between the intervals of the signal Vi and the output bits of the comparators.
Figure 12:
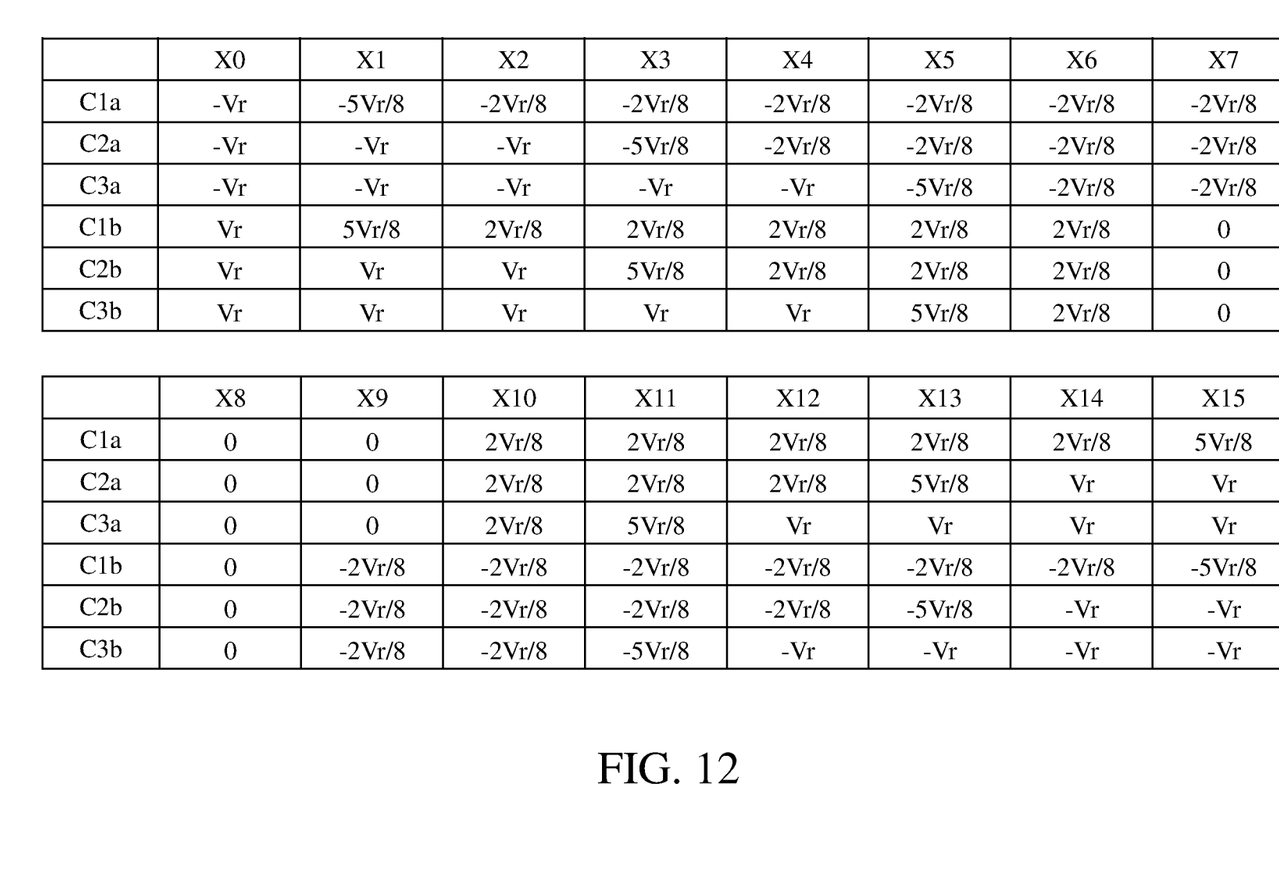
FIG. 12 shows the truth table of the decoder.

FIG. 10 shows the relationship between the output signal $V_{out}(=V_{out}^+-V_{out}^-)$ and the signal Vi. The signal Vi is divided into 16 intervals (X0, X1, X2, X3, X4, X5, X6, X7, X8, X9, X10, X11, X12, X13, X14, and X15) by the 15 preset voltages. Similar to the previous embodiment, the range of the output signal $V_{out}(=V_{out}^+-V_{out}^-)$ falls only within the range between 0 and Vr/2. FIG. 11 shows the relationship between the intervals of the signal Vi and the output bits of the comparators, and FIG. 12 shows the truth table of the decoder 820.

Figure 13:
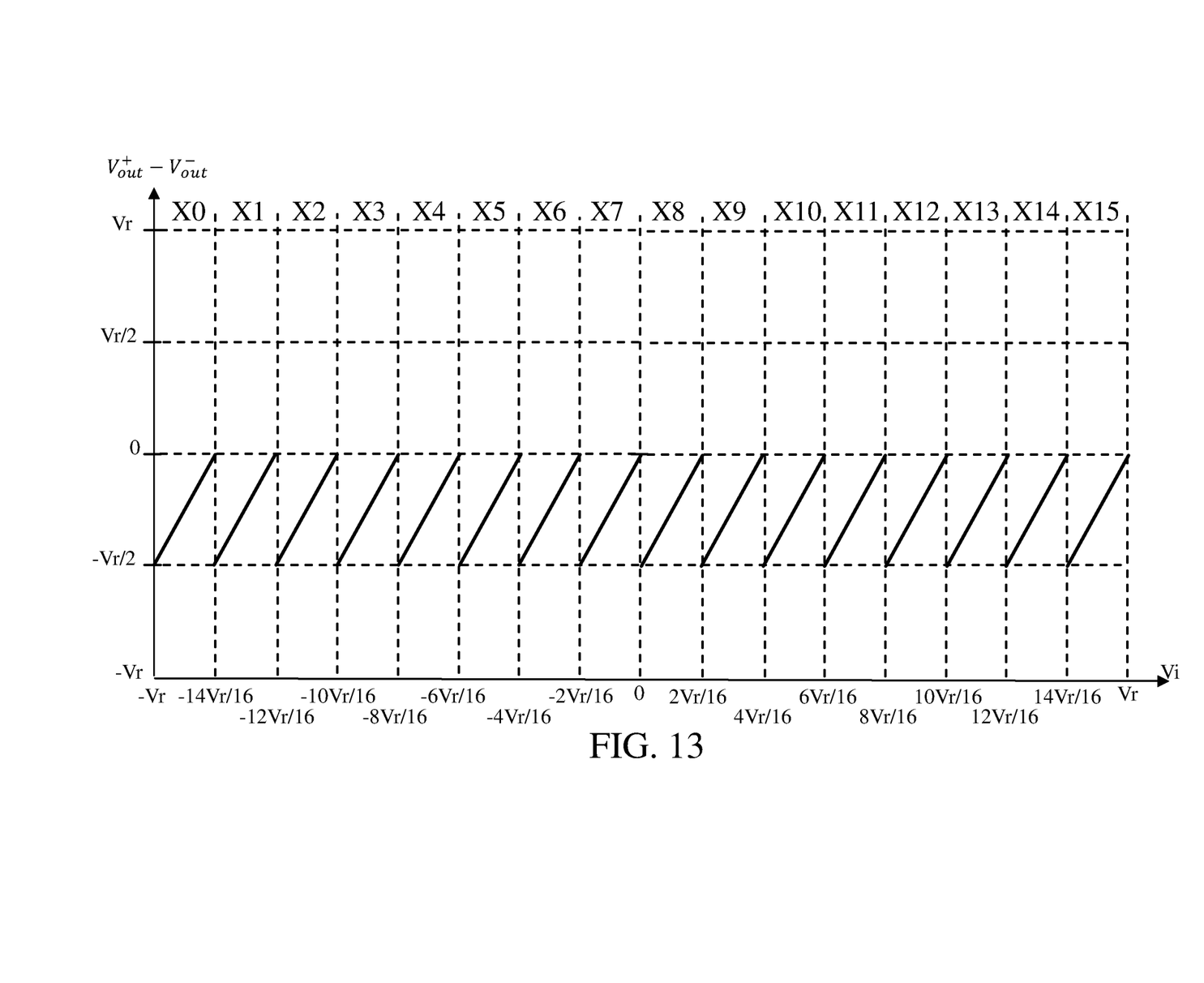
FIG. 13 shows the relationship between the output signal and the signal Vi.
Figure 14:
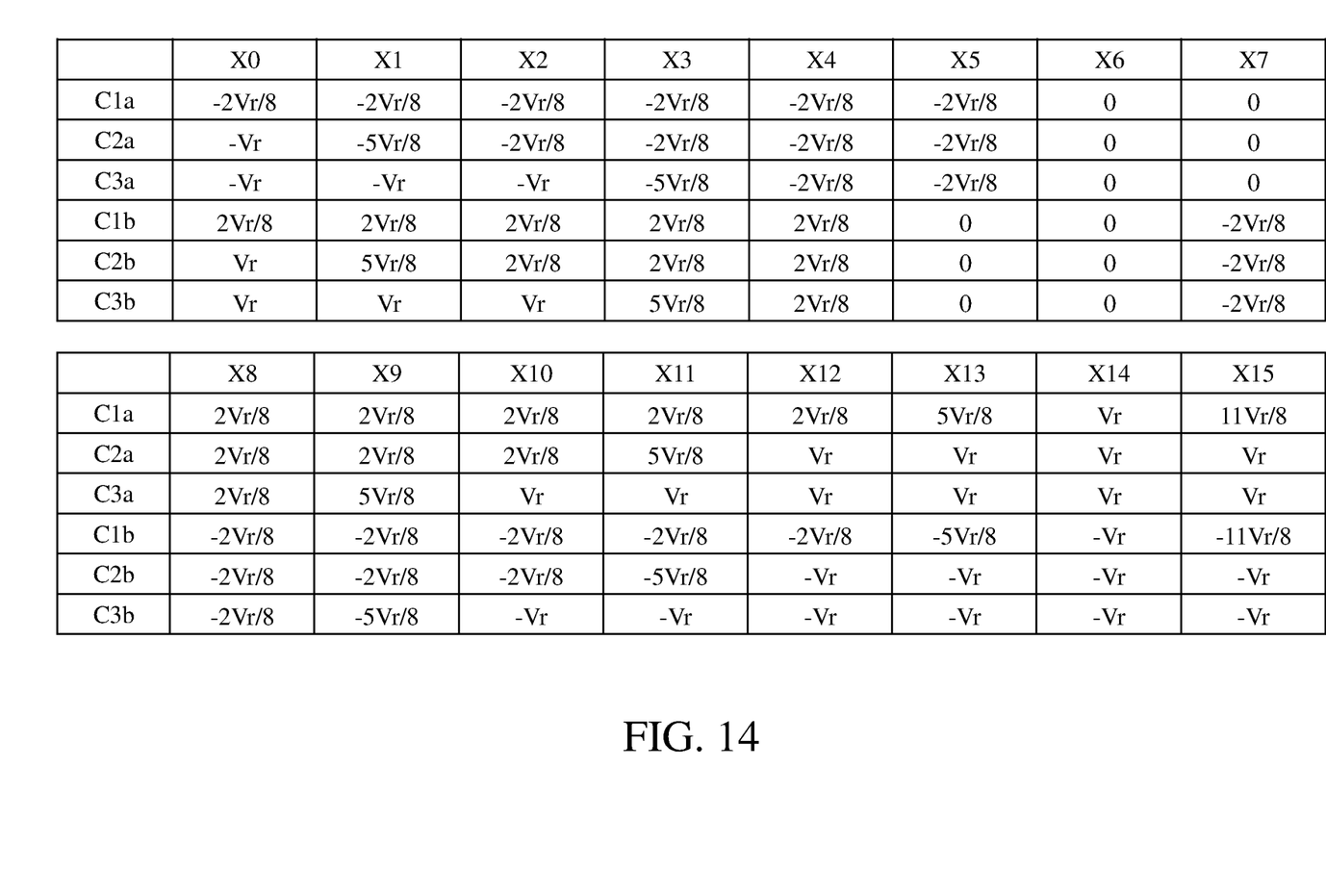
FIG. 14 shows the truth table of the decoder.

In an alternative embodiment, the range of the output signal $V_{out}(=V_{out}^+-V_{out}^-)$ is controlled within a different target range, for example, between −Vr/2 and 0, as shown in FIG. 13. FIG. 14 shows the truth table corresponding to the decoder 820 of FIG. 13 (the aforementioned 9 reference voltages may be −11Vr/8, −Vr, −5Vr/8, −2Vr/8, 0, 2Vr/8, 5Vr/8, Vr, and 11Vr/8).

In summary, the present invention improves the linearity of the SC circuit by controlling the ranges of the output signals $V_{out}^+$ and $V_{out}^-$. The present invention is not limited to the embodiments shown in FIG. 2 and FIG. 8. Based on the above discussions, people having ordinary skill in the art can apply the present invention to SC circuits including more capacitors.

Please note that the shape, size, and ratio of any element in the disclosed figures are exemplary for understanding, not for limiting the scope of this invention.

The aforementioned descriptions represent merely the preferred embodiments of the present invention, without any intention to limit the scope of the present invention thereto. Various equivalent changes, alterations, or modifications based on the claims of the present invention are all consequently viewed as being embraced by the scope of the present invention.

What is claimed is:

1. A comparator-based switched-capacitor (SC) circuit having a first input terminal, a second input terminal, a first output terminal, and a second output terminal, the comparator-based SC circuit comprising:
   a comparator;
   an analog-to-digital converter (ADC) coupled to the first input terminal and the second input terminal;
   a decoder coupled to the ADC;
   a first switch;
   a second switch;
   a third switch;
   a fourth switch;
   a fifth switch;
   a sixth switch;
   a seventh switch;
   an eighth switch;
   a ninth switch;
   a tenth switch;
   a first current source coupled to the comparator and the first output terminal;
   a second current source coupled to the comparator and the second output terminal;
   a first capacitor having a first end and a second end, the first end being coupled to the first input terminal through the first switch and coupled to the first output terminal through the fourth switch, and the second end being coupled to the comparator and coupled to a reference voltage through the third switch;

a second capacitor having a third end and a fourth end, the third end being coupled to the first input terminal through the second switch and coupled to the decoder through the fifth switch, and the fourth end being coupled to the comparator and coupled to the reference voltage through the third switch;

a third capacitor having a fifth end and a sixth end, the fifth end being coupled to the second input terminal through the sixth switch and coupled to the second output terminal through the ninth switch, and the sixth end being coupled to the comparator and coupled to the reference voltage through the eighth switch; and a fourth capacitor having a seventh end and an eighth end, the seventh end being coupled to the second input terminal through the seventh switch and coupled to the decoder through the tenth switch, and the eighth end being coupled to the comparator and coupled to the reference voltage through the eighth switch.

2. The comparator-based SC circuit of claim 1, wherein the ADC comprises N comparator(s), the ADC outputs a digital signal of N bit(s), N is a positive integer, and the decoder provides a target reference voltage to the third end of the second capacitor or the seventh end of the fourth capacitor; wherein a voltage at the first output terminal and a voltage at the second output terminal do not exceed a target range.

3. The comparator-based SC circuit of claim 2, wherein N is seven, and the ADC comprises seven comparators.

4. The comparator-based SC circuit of claim 3, wherein the decoder receives a first reference voltage, a second reference voltage, a third reference voltage, a fourth reference voltage, and a fifth reference voltage, the target reference voltage is one of the first reference voltage, the second reference voltage, the third reference voltage, the fourth reference voltage, and the fifth reference voltage, and one the first reference voltage, the second reference voltage, the third reference voltage, the fourth reference voltage, and the fifth reference voltage is substantially zero volts.

5. The comparator-based SC circuit of claim 2, wherein N is 15, and the ADC comprises 15 comparators.

6. The comparator-based SC circuit of claim 5, wherein the decoder receives a first reference voltage, a second reference voltage, a third reference voltage, a fourth reference voltage, a fifth reference voltage, a sixth reference voltage, and a seventh reference voltage, the target reference voltage is one of the first reference voltage, the second reference voltage, the third reference voltage, the fourth reference voltage, the fifth reference voltage, the sixth reference voltage, and the seventh reference voltage, and one of the first reference voltage, the second reference voltage, the third reference voltage, the fourth reference voltage, the fifth reference voltage, the sixth reference voltage, and the seventh reference voltage is substantially zero volts.

7. The comparator-based SC circuit of claim 2, wherein an upper or lower limit of the target range is substantially zero volts.

8. The comparator-based SC circuit of claim 1, wherein the SC circuit operates in a first phase or a second phase; in the first phase, the first switch, the second switch, the third switch, the sixth switch, the seventh switch, and the eighth switch are turned on, while the fourth switch, the fifth switch, the ninth switch, and the tenth switch are turned off; in the second phase, the first switch, the second switch, the third switch, the sixth switch, the seventh switch, and the eighth switch are turned off, while the fourth switch, the fifth switch, the ninth switch, and the tenth switch are turned on.

9. The comparator-based SC circuit of claim 8 further comprises:
an eleventh switch coupled between the first output terminal and a power supply voltage; and
a twelfth switch coupled between the second output terminal and a ground level.

10. The comparator-based SC circuit of claim 9, wherein the second phase comprises a sub-phase, and the eleventh switch and the twelfth switch are turned on in the sub-phase.

* * * * *